United States Patent [19]
Geddes et al.

[11] Patent Number: 5,596,704
[45] Date of Patent: Jan. 21, 1997

[54] PROCESS FLOW DIAGRAM GENERATOR

[75] Inventors: David D. Geddes, Katy; Basil Joffe; Patrick P. Davis, both of Houston, all of Tex.

[73] Assignee: Bechtel Group, Inc., San Francisco, Calif.

[21] Appl. No.: 151,067

[22] Filed: Nov. 11, 1993

[51] Int. Cl.$^6$ .............................. G06F 3/14; G06F 17/50
[52] U.S. Cl. .................. 395/326; 395/140; 395/348; 364/188; 364/500
[58] Field of Search .................... 395/161, 159, 395/160, 155, 157, 140; 364/188, 578, 500, 501, 469, 149, 151, 192

[56] References Cited

U.S. PATENT DOCUMENTS

| | | | |
|---|---|---|---|
| 4,901,221 | 2/1990 | Kodosky et al. | 395/159 |
| 5,062,068 | 10/1991 | Kondo | 364/578 |
| 5,168,441 | 12/1992 | Onarheim et al. | 364/188 X |
| 5,233,688 | 8/1993 | Too | 395/161 |
| 5,313,574 | 5/1994 | Beethe | 395/159 |
| 5,377,315 | 12/1994 | Leggett | 395/140 |
| 5,481,668 | 1/1996 | Marcus | 395/161 |

*Primary Examiner*—Raymond J. Bayerl
*Attorney, Agent, or Firm*—Townsend and Townsend and Crew LLP

[57] ABSTRACT

A method and apparatus for creating a process flow diagram from a process model. Process models include processing nodes and process streams. User defined process models can be stored and retrieved for later use. A processor utilizes the process model to determine coordinates for each node and to determine the routing coordinates for each process stream for display. Icons are substituted for nodes for display on the output device, and lines are substituted for process streams also for display on the output device.

6 Claims, 17 Drawing Sheets

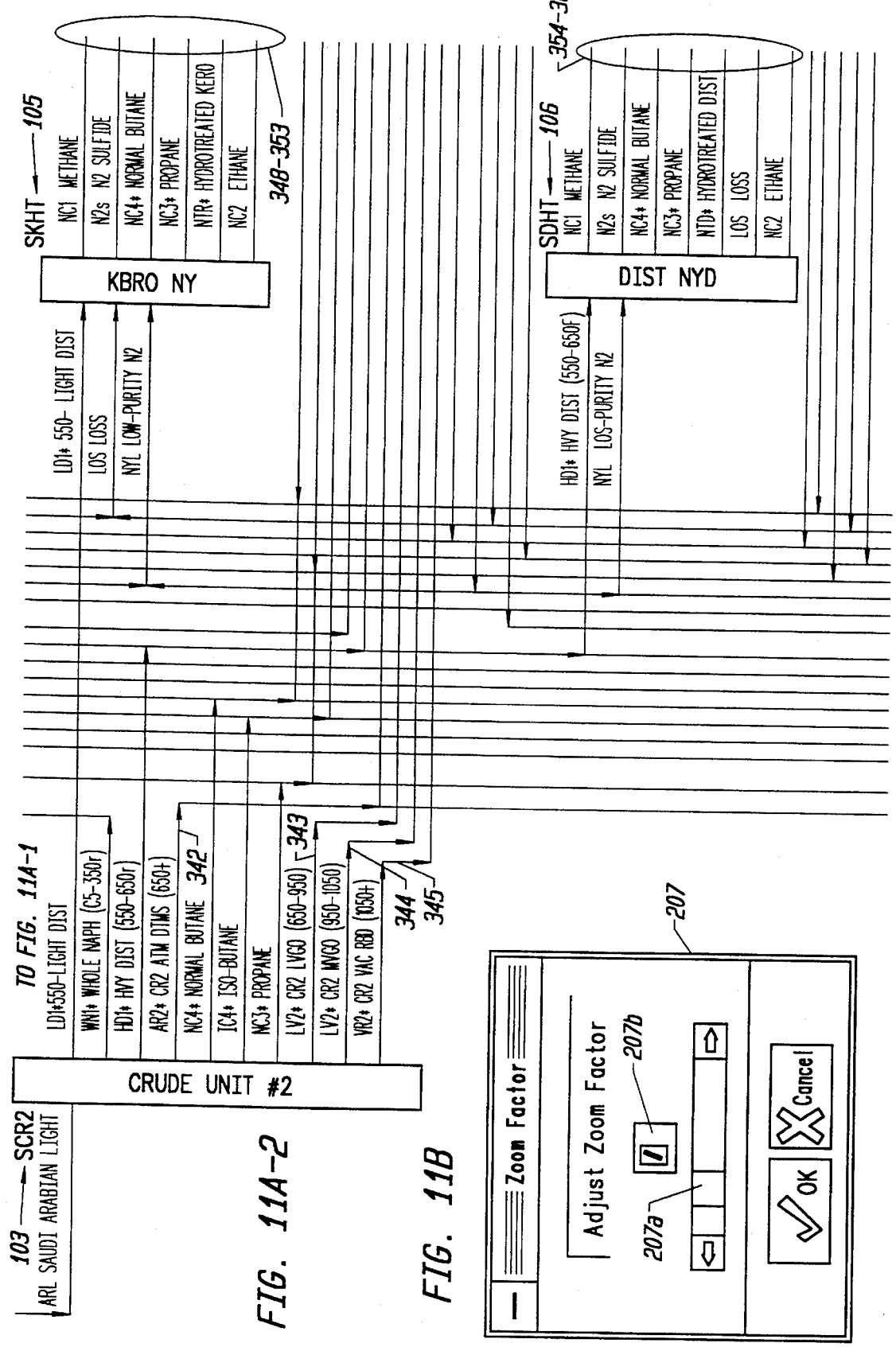

ns5,596,704

PROCESS FLOW DIAGRAM GENERATOR

FIELD OF THE INVENTION

This invention relates generally to the automatic construction of Process Flow Diagrams (PFDs) from a data source such as a linear programming model, and specifically to automatic construction of PFDs for process models in the Refining, Chemical and Petrochemical fields.

BACKGROUND OF THE INVENTION

Process Flow Diagrams (PFDs) are graphic representations of process models. Diagrams typically contain a plurality of processing stages, or nodes, with a plurality of interconnecting lines. These interconnecting lines, also called process streams, represent physical transfer of material between interconnected nodes. Linear Programming (L.P.) models for refining, chemical and petrochemical plants are known in the industry and have in the past been used to optimize process plant economics. An L.P. model is created by running an L.P. optimizer on the process model.

PFDs have typically been created manually or with a Computer Aided Design (CAD) or Drafting program. This required the user to determine the layout of every processing node and the routing of every process stream in the PFD.

Once a PFD has been generated, subsequent modifications to the process model including hiding of zero flow streams, hiding of selected processing nodes, hiding of process streams, forming and modifying groups of processing nodes, and optimizing the process model, required extensive manual modification to the original PFD. The difficulty and tedium of this task of creating and modifying PFDs has virtually precluded the construction of PFDs from L.P. models in the Process Industries.

SUMMARY OF THE INVENTION

The present invention provides a system for efficiently creating a Process Flow Diagram (PFD) from a process model, such as an L.P. model. The process model includes nodes, which represent processes, and process streams, which represent material transfers between interconnected nodes. The present invention provides an effective and easy-to-use user interface for making real-time modifications to the model.

Automatic creation of a PFD or modification of an existing PFD is performed conveniently and efficiently on a computer system. The computer system includes a processor for calculation, an output device for a user to view the resulting PFD, a user input device for data entry, and a storage means for data entry and retrieval.

In one embodiment the user input device is used to enter the process model into the computer for processing. Alternatively, process models can be retrieved from the storage means for processing. Once the process model has been generated, the processor determines the placement of each of the nodes and puts them onto the output device. After all nodes have been placed, the processor determines the routing for each of the process streams and puts them onto the output device. When the PFD is displayed onto the output device, nodes are represented by icons, and the process streams are represented by lines.

In other embodiments, once the PFD is generated and output onto the output device, as above, users can select portions of the process model for display. If a certain icon on the PFD is selected, the output device will display the icon, enlarged, showing lines with textual descriptions of the material represented by each line. In one embodiment, if the enlarged icon is again selected, the output device will display the operational characteristics of that node from the process model. In another embodiment, if a stream emanating from the enlarged icon is selected, the output device will display the physical property of the material being represented, as well as the flow rate from the process model.

BRIEF DESCRIPTION OF THE DRAWINGS

FIG. 11b is an illustration of a user zoom factor selector;

DESCRIPTION OF A PREFERRED EMBODIMENT

A preferred embodiment of the present invention is commercially available in a software package called PIMS® (Process Industry Modeling System) sold by Bechtel Corporation, Inc. The user manual should be consulted for a more specific embodiment of the present invention, as disclosed in the following specification.

Figure 1:
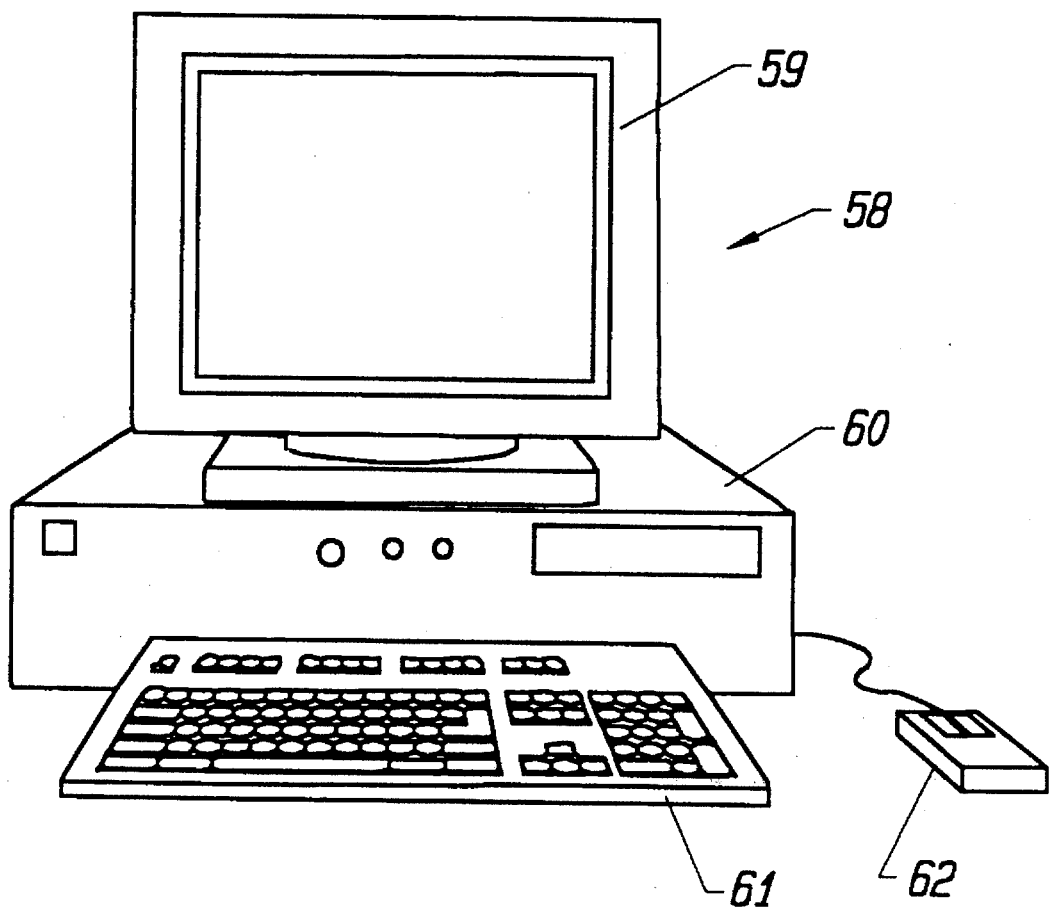
FIG. 1 is an illustration of an example of a computer system used for executing the present invention.

FIG. 1 shows an example of a computer system used to execute the software of the present invention. FIG. 1 shows a computer system 58 which includes a display 59, a cabinet 60, a keyboard 61 and a mouse 62. Cabinet 60 houses familiar computer components such as a processor and a storage means such as memory, disk drive, etc. FIG. 1 is representative of one type of computer system for embodying the present invention. Other types of computer systems are suitable for use in the present invention including portable computers and networked computers. The term "user input device" refers to keyboard 60 entry, mouse 61 entry, or other means for inputting information into a computer such as a trackball, light pen, etc. It will be readily apparent to one of ordinary skill in the art that many computer system types and configurations are suitable for use in conjunction with the present invention.

Figure 2:
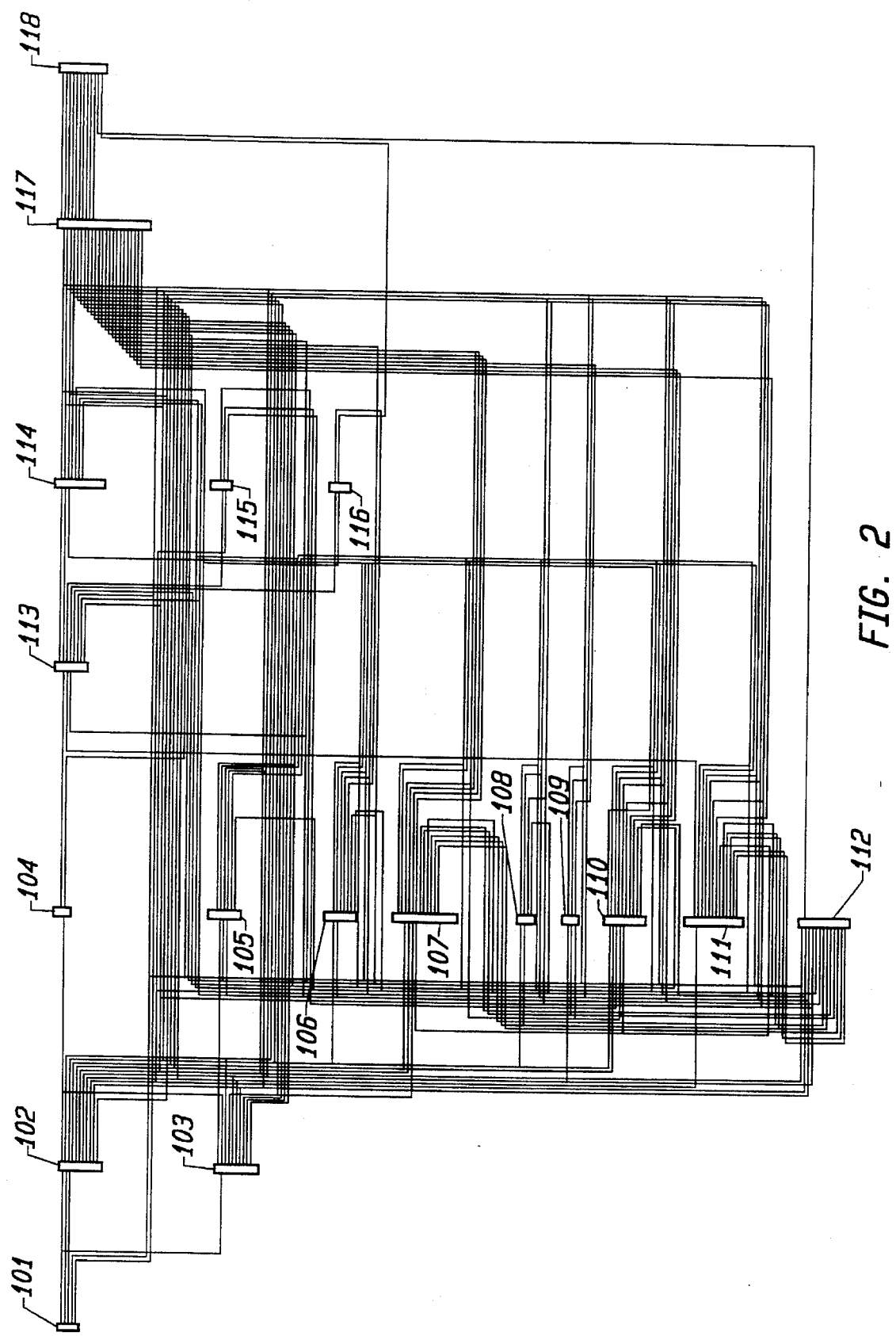
FIG. 2 is illustration of an automatically generated Process Flow Diagram.

FIG. 2 is an illustration of a Process Flow Diagram (PFD) of a process model generated by the present invention. Icons 101–118 are representations of processing units, or nodes, in the process model. Each processing node performs a physical process on material entering on the left side of each icon. The material generated in each processing node is output from the right side of each icon. It should be apparent that the left/right order can readily be reversed. Buy 101 and Sell 118 icons do not involve physical processing and thus do not require inputs of materials or outputs of materials respectively.

Lines between the icons 101–118 are called process streams. Process streams are transfers of materials from one node to another.

Figure 3:
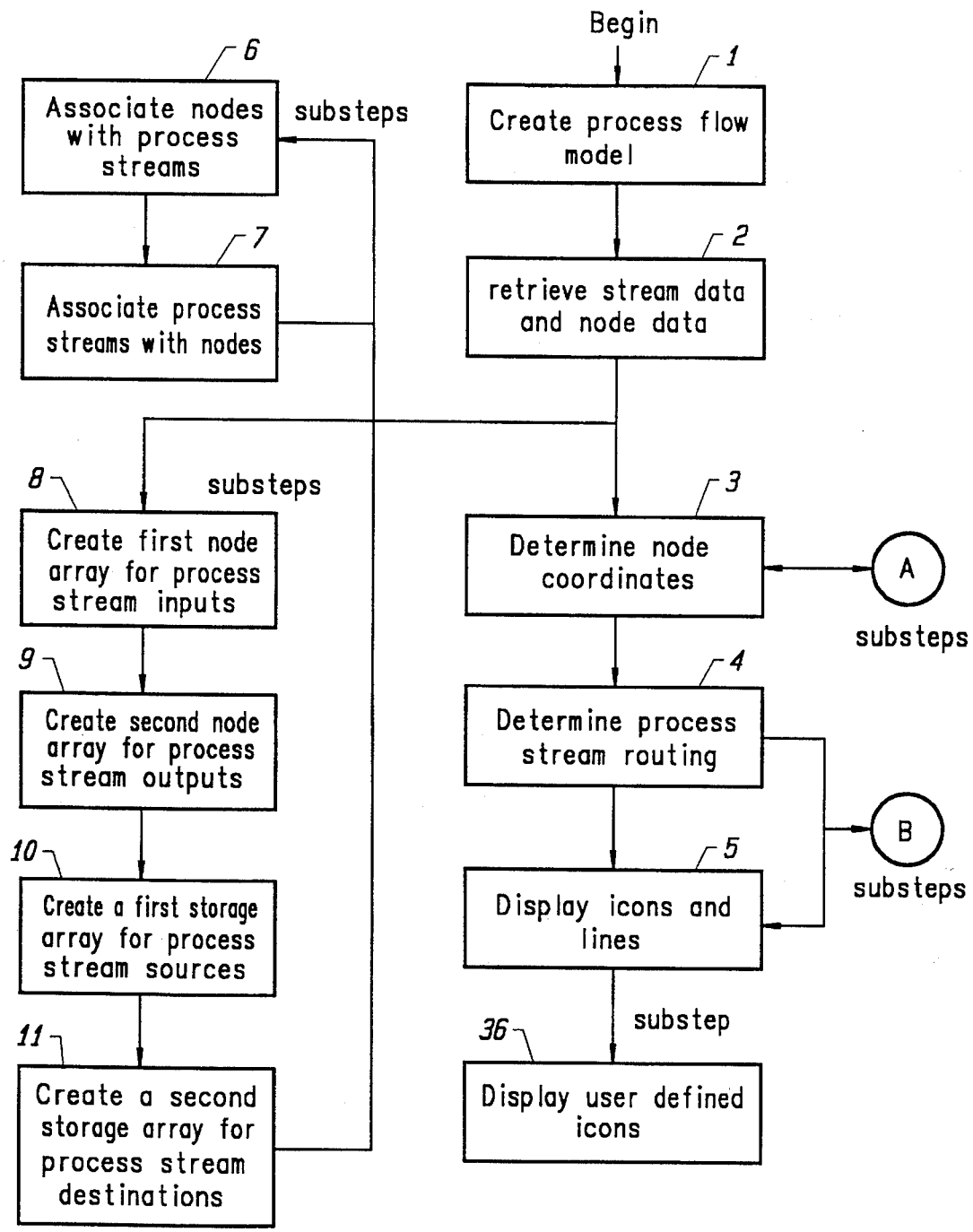
FIG. 3 is a flowchart for an embodiment of the invention.

FIG. 3 is a representative flowchart of the method of creating a PFD. In Block 1, a process model is created by entry of data into the computer system 58. In a preferred embodiment, the process model is created from tables of data which are entered onto a computer through a spreadsheet program such as Lotus 1, 2, 3® or Microsoft Excel®. These tables contain the processing nodes to be used, the material input and output requirements for the nodes, as well as other model conditions. Other ways for defining the relational data for a process model should be apparent, such as with a relational database or with a word processor. An example of tables describing a process model is found in Table 1–5.

Once a process model has been created it can be stored and retrieved from the storage means of computer system 58 of FIG. 1 as indicated by Block 2 of FIG. 3. With the process model data retrieved, a user can choose to execute a Linear Programming optimizer on the data. L.P. optimizing is a commonly used method for optimizing the process stream data in process models. The preferred embodiment incorporates the PIMS (Process Industry Modeling System) L.P. system as developed by Bechtel Corporation, Inc. The use of other optimizing algorithms or packages for this invention should be readily apparent to one skilled in the art.

The process model can be either user-entered data, or, in the more typical case, the optimized version of user-entered data. It should be obvious that a user does not need to create a process model from scratch, but can modify existing process model data to create a new process model.

Once the process model has been created the diagramming of the model is initiated. In one embodiment of the present invention, the nodes are associated with process streams into and out of each node, Block 6, and each process stream is associated with nodes which supply and consume each process stream, Block 7. The associations in Block 6 and 7 provide convenient associations for later processing Blocks.

In the preferred embodiment of the present invention, processing of Blocks 8–11 is now performed. In Block 8, a two-dimensional array is created with each node associated with one row and each process stream associated with one column. Each location in this array represents whether a process stream in a particular column is consumed by the node in a particular row. If the node does consume the process stream, it is indicated in the array location.

In Block 9, another two-dimensional array is created with each node associated with one row and each process stream associated with one column. Each location in this array represents whether a process stream in a particular column is produced by the node in a particular row. If the node does produce the process stream, it is indicated in the array location.

In Block 10, a two-dimensional array is created with each process stream associated with one row and each node associated with one column. Each location in this array represents whether a process stream in a particular row is produced by the node in a particular column. If the node does produce the process stream, it is indicated in the array location.

In Block 11, another two-dimensional array is created with each process stream associated with one row and each node associated with one column. Each location in this array represents whether a process stream in a particular row is consumed by the node in a particular column. If the node does consume the process stream, it is indicated in the array location.

Figure 15:
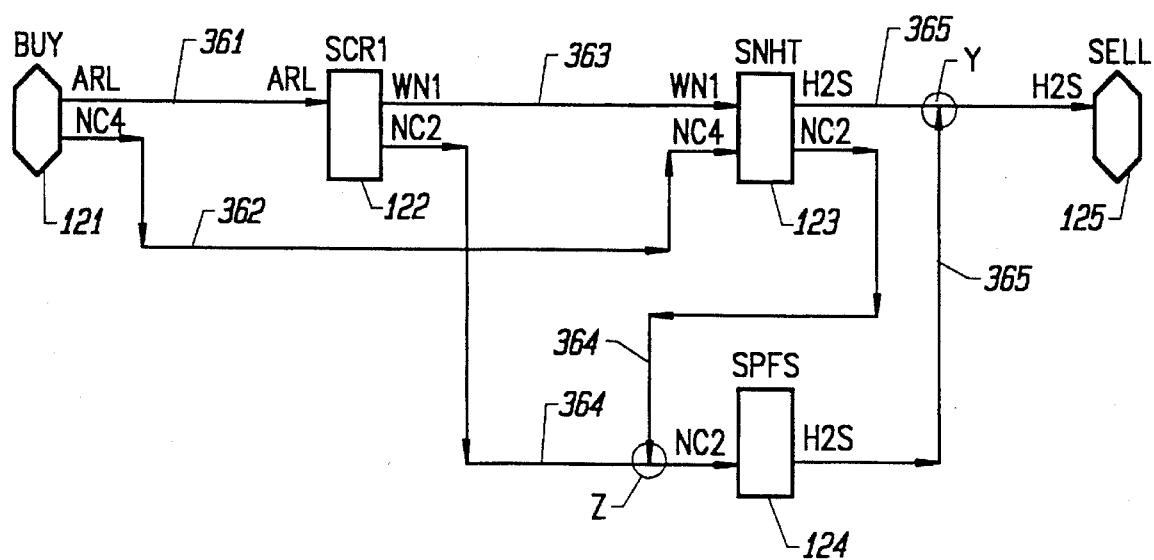
FIG. 15 is an illustration of a Process Flow Diagram generated from the data in Table 1–5.

An example of processing by Blocks 8–11 is shown in Tables 1–4 below. In this example, the process flow diagram of FIG. 15 is generated by using the steps described below. Tables such as 1–5 are intermediate data tables constructed during processing according to the method of the present invention. For example, in Table 1, node SNHT consumes process streams WN1 and NC4. This is also shown graphically in FIG. 15. In FIG. 15, Icon 123 has inputs 363 and 362, representing SNHT, WN1 and NC4, respectively. It should be understood that Tables 1–5, below, are merely representative of the method of processing, these types of tables may or may not actually be generated and displayed to the user.

TABLE 1

|  | NC2 | ARL | H2S | NC4 | WN1 |
|---|---|---|---|---|---|
| BUY |  |  |  |  |  |
| SCR1 |  | YES |  |  |  |
| SNHT |  |  |  | YES | YES |
| SPFS | YES |  |  |  |  |
| SELL |  |  | YES |  |  |

TABLE 2

|  | NC2 | ARL | H2S | NC4 | WN1 |
|---|---|---|---|---|---|
| BUY |  | YES |  | YES |  |
| SCR1 | YES |  |  |  | YES |
| SNHT | YES |  | YES |  |  |
| SPFS |  |  | YES |  |  |
| SELL |  |  |  |  |  |

TABLE 3

|  | BUY | SCR1 | SNHT | SPFS | SELL |
|---|---|---|---|---|---|
| NC2 |  | YES | YES |  |  |
| ARL | YES |  |  |  |  |
| H2S |  |  | YES | YES |  |
| NC4 | YES |  |  |  |  |
| WN1 |  | YES |  |  |  |

TABLE 4

|  | BUY | SCR1 | SNHT | SPFS | SELL |
|---|---|---|---|---|---|
| NC2 |  |  |  | YES |  |
| ARL |  | YES |  |  |  |
| H2S |  |  |  |  | YES |
| NC4 |  |  | YES |  |  |
| WN1 |  |  | YES |  |  |

Figure 4:
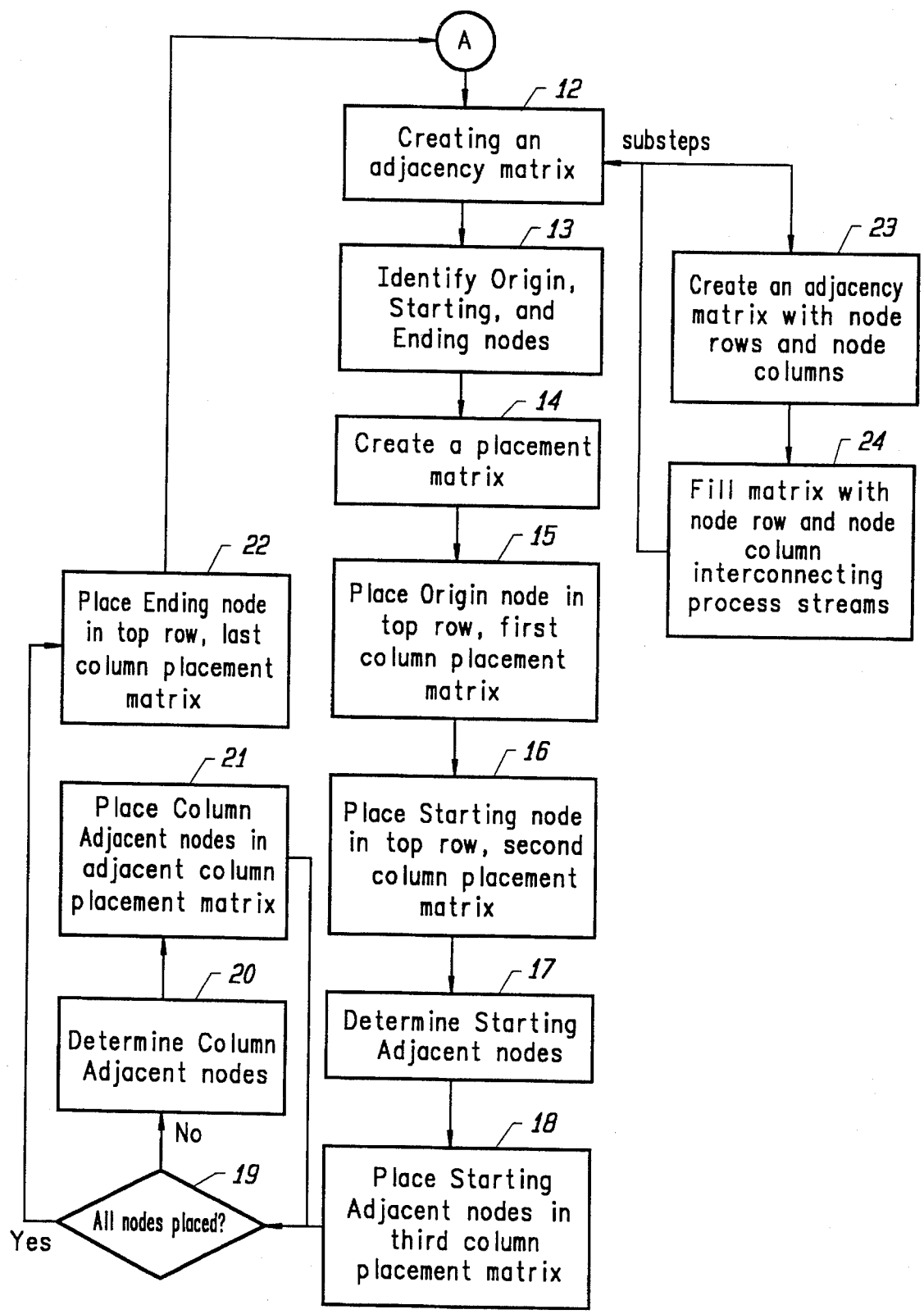
FIG. 4 is a detailed flowchart for the node placement.

Determining node coordinates is the next step in producing a process flow diagram, Block 3. In a preferred embodiment, processing in Blocks 12–24, FIG. 4, are executed to determine node placement.

In Block 12, a node adjacency matrix is created. In a preferred embodiment, an adjacency matrix is created with node rows and node columns, Block 23, and the matrix, Block 24 is filled. In Block 23, a two-dimensional array is created, with each node associated with one row and one column. Each location in the matrix represents whether a node in a particular row produces materials or consumes materials used in a node in a particular column. This is repeated for all rows and columns.

Table 5 shows the contents of the array from the process model included in Appendix B, after performance of Blocks 23–24. For example, in Table 5, the process node SCR1 (row entry) produces process stream WN1 for input into processing node SNHT (column entry), produces process stream NC2 for input into processing node SPFS (column entry) and consumes process stream ARL from the BUY node (column entry). As can be seen, in FIG. 15, icon 122 is connected to icon 123 by line 363, is connected to icon 124 by line 364, and is connected to icon 121 by line 361.

TABLE 5

|      | BUY   | SCR1  | SNHT  | SPFS  | SELL  |
|------|-------|-------|-------|-------|-------|
| BUY  |       | >ARL  | >NC4  |       |       |
| SCR1 | <ARL  |       | >WN1  | >NC2  |       |
| SNHT | <NC4  | <WN1  |       | >NC2  | >H2S  |
| SPFS |       | <NC2  | <NC2  |       | >H2S  |
| SELL |       |       | <H2S  | <H2S  |       |

In Block 13, the Origin node and the Ending node are identified. The process model also determines starting nodes, which can be user definable. These nodes are identified for specific placement one the process flow diagram. In a preferred embodiment, the Origin node is a BUY node, and the Ending node is the SELL node. In the example in FIG. 15, the BUY node is the origin node and represented by icon 121, the SELL node is the ending node and represented by icon 125, and the starting node is represented by icon 122.

An output placement matrix is created in Block 14. This placement matrix is used to lay out the process flow diagram for display.

In Block 15, the Origin node is placed in the top row and first column in the placement matrix. In a preferred embodiment, the Origin node is placed in the top left hand corner of the matrix, and subsequent processing nodes are placed in columns to the right of the Origin node column. It should be obvious that the Origin node could also be placed in the rightmost column of the placement matrix or in any row of the placement matrix. In the example in FIG. 15, icon 121 representing the Origin node is placed on the top row, leftmost column of the display.

In Block 16, the Starting nodes are placed in the top row and second column in the placement matrix. In a preferred embodiment, the Starting nodes are placed in the column immediately to the right of the Origin node. If there is more than one Starting node, the first node is placed in the top row and subsequent nodes are placed into the next available lower row, in the order of identification for Starting nodes. It should be obvious that nodes could also be placed in a bottom to top configuration in the matrix, with the first node placed into the bottom row and subsequent nodes placed in the next available higher row. In the example in FIG. 15, icon 122 representing node SCR1 is the Starting node and is placed in the top row of a second column of the display.

In Block 17, nodes which are adjacent to the Starting nodes are identified. In the preferred embodiment, this is accomplished through use of the node adjacency matrix referred to by Blocks 12, 23, and 24. (See above.) The nodes which directly consume process streams produced by the Starting nodes are identified. In the example in FIG. 15, the single Starting node is SCR1. Using the adjacency matrix in Table 5, row SCR1 has WN1 output connections with SNHT, and NC2 output connections with SPFS. SNHT and NC2 are adjacent to the Starting node, and labeled "Starting Adjacent nodes."

In Block 18, Starting Adjacent nodes are placed in the third column in the placement matrix. In a preferred embodiment, the Starting Adjacent nodes are placed in the column immediately to the right of the Starting nodes. If there is more than one Starting Adjacent node, the first node is placed in the top row and subsequent nodes are placed into the next lower available row, in the order of identification for a Starting Adjacent node. Other predetermined ordering for the nodes are possible. In the example in FIG. 15, icon 123 representing node SNHT and icon 124 representing node SPFS are the Starting Adjacent nodes and are placed in the third column of the display: SNHT in the first row, SPFS in the next row.

In Block 19, if there are no more remaining nodes to be identified or placed onto the placement matrix, other than the Ending node, processing continues in Block 22. If there are remaining nodes, processing continues in Block 20. In the example in FIG. 15, nodes BUY, SCR1, SNHT, and SPFS have been placed in the placement matrix; other than the SELL node, there are no unplaced nodes, thus processing continues with Block 22.

In Block 20, nodes which are adjacent to the preceding column's nodes are identified. In the preferred embodiment, this is accomplished through use of the node adjacency matrix referred to by Blocks 12, 23, and 24. (See above.) The nodes which directly consume process streams produced by the preceding column's nodes are identified, and are called "Column Adjacent nodes." In the example in FIG. 15, there are no Column Adjacent nodes.

In Block 21, Column Adjacent nodes are placed in the next available column in the placement matrix. In a preferred embodiment, the Column Adjacent nodes are placed in the column immediately to the right of the preceding nodes. If there is more than one Column Adjacent node, the first node is placed in the top row and subsequent nodes are placed into the next available lower row, in the order of identification for a Column Adjacent node. In the example in FIG. 15, there are no Column Adjacent nodes.

After placement of Column Adjacent nodes, processing continues with Block 19, for the remaining unidentified, unplaced nodes.

In Block 22, the Ending node is placed in the last column in the placement matrix. In a preferred embodiment, the ending node is placed in the top row of the column immediately to the right of the previously filled column. It should be obvious that the Ending node could also be placed in any row in the matrix. In the example in FIG. 15, icon 125 representing node SELL is the Ending node and is placed in the last column of the display.

Figure 5:
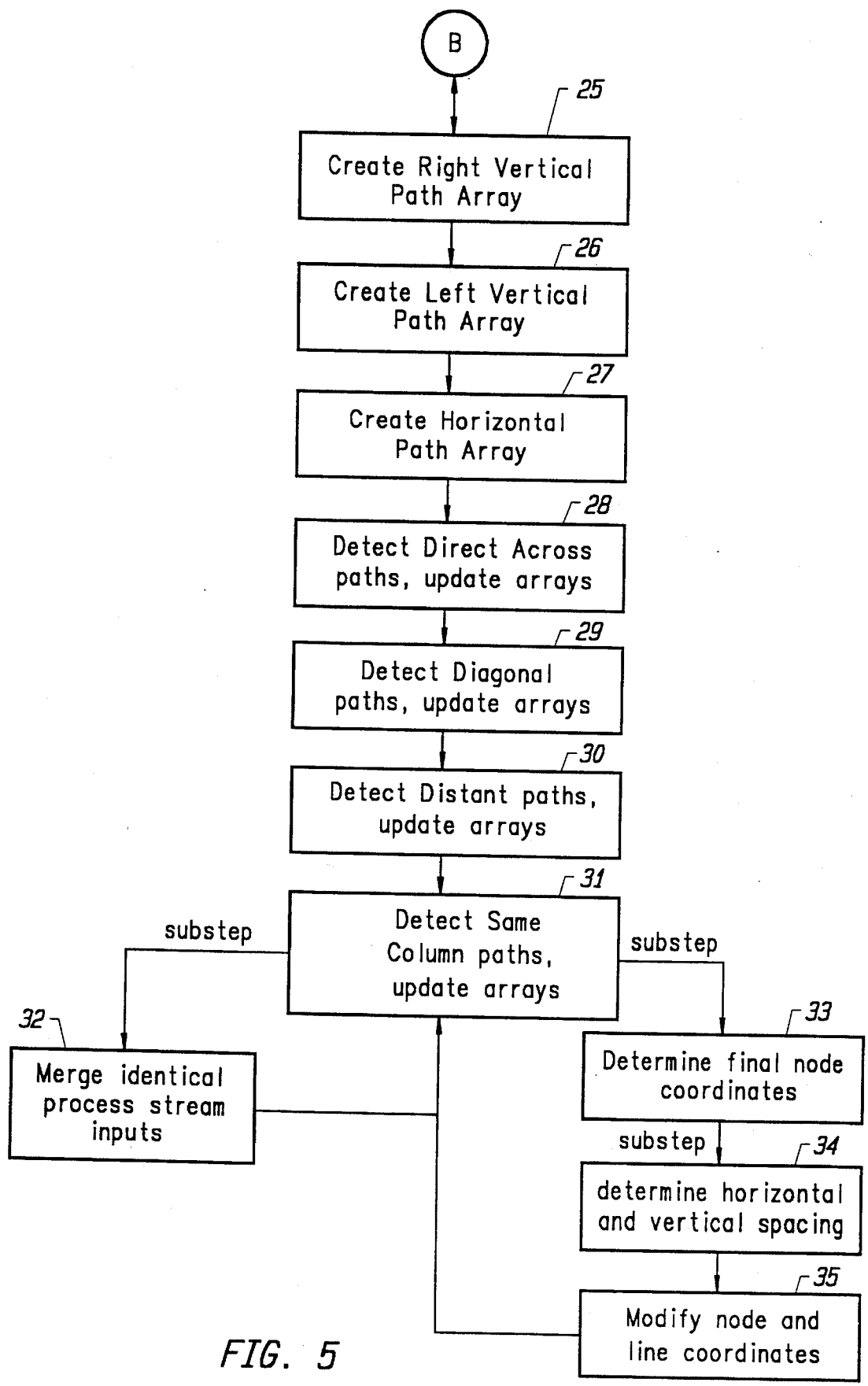
FIG. 5 is a detailed flowchart for the process stream routing.

Once the output coordinates for all the nodes have been placed, determining coordinate routing for the process stream interconnections is the next step in producing a process flow diagram, Block 4, FIG. 3. In a preferred embodiment, processing in Blocks 25–34, FIG. 5, is also performed to determine the process stream routing.

In Block 25, a Right Vertical Path array is formed. In the preferred embodiment this array is a one-dimensional array, with each node associated with one location in the array. The entry into the array is the number of process streams which are connected to the right side of each node. An example of this is in FIG. 15, SCR1 should have the associated Right Vertical Path array entry of two.

In Block 27, a Left Vertical Path array is formed. In the preferred embodiment this array is a one-dimensional array, with each node associated with one location in the array. The entry into the array is the number of process streams which are connected to the left side of each node. An example of this is in FIG. 15, SNHT has the associated Left Vertical Path array entry of two.

In Block 27, a Horizontal Path array is formed. In the preferred embodiment this array is a one-dimensional array, with each node associated with one location in the array. The entry into the array is the number of process streams which pass underneath each node. An example of this is in FIG. 15, SCR1 has the associated Horizontal Path array entry of one.

The three above arrays are filled by Blocks 28–31, and in a preferred embodiment also by Block 32.

In Block 28, processing streams which are "Direct Across," from the output of one node to the input of another node, are detected. A processing stream is Direct Across when two nodes, located in the same row, and in adjacent columns, are connected by that processing stream. The Right Vertical Path array and Left Vertical Path array are updated in response to a Direct Across determination. For example in FIG. 15, lines 361, 363, and 365 (from icon 123 to 125) are Direct Across.

In Block 29, processing streams which are "Diagonal," from the output of one node to the input of another node, are detected. A processing stream is Diagonal when two nodes, located in adjacent rows (but not the same row) and in adjacent columns (but not the same column), are connected by that processing stream. The Right Vertical Path array, Left Vertical Path array, and Horizontal Path array are updated in response to a Diagonal determination. For example in FIG. 15, lines 364 (from icon 122 to 124) and 365 (from icon 124 to 125) are Diagonal.

In Block 30, processing streams which are "Distant," from the output of one node to the input of another node, are detected. A processing stream is Distant when two nodes, not located in adjacent rows (or the same row) or not located in adjacent columns (or the same column), are connected by that processing stream. The Right Vertical Path array, Left Vertical Path array, and Horizontal Path array are updated in response to a Diagonal determination. For example in FIG. 15, line 362 is Distant.

In Block 31, processing streams which are in "Same Column," from the output of one node to the input of another node are detected. A processing stream is Same Column when two nodes, located in the same column, are connected by that processing stream. The Right Vertical Path array, Left Vertical Path array, and Horizontal Path array are updated in response to a Same Column determination. For example in FIG. 15, line 364 (from icon 123 to 124) is Same Column.

In an embodiment of the present invention, Block 32 performs the task of merging identical process streams. When a node has two or more process stream inputs which have identical process streams, the process streams are merged. The Right Vertical Path array, Left Vertical Path array, and Horizontal Path array are updated in response to this merged determination. For example in FIG. 15 lines 364 from icon 122 and 123 are merged at point Z, and line 365 from icon 123 and 124 are merged at point Y.

Once processing in Blocks 25–32 has been performed, processing can return to Block 5 for further processing. In an alternative embodiment, processing can continue by processing in Blocks 33–35.

In Block 33, after the right vertical, left vertical, and Horizontal Path arrays have been generated, the final node coordinates can be determined. These final node coordinates are used in the subsequent processing stage, Block 5.

In a preferred embodiment of Block 33, processing in Blocks 34 and 35 are included. In Block 34, horizontal and vertical spaces are determined for each associated node in relation to the entries in the Right Vertical Path array, Left Vertical Path array and Horizontal Path array in steps 25–32.

In Block 35, final node coordinates are then calculated. Before this point in processing, node coordinates are calculated by processing Block 3, or in a preferred embodiment by processing Blocks 12–24. These coordinates are then modified by adding the associated horizontal and vertical spaces around each node according to the spaces calculated in Block 34. These modified coordinates for each node are used in the subsequent processing stage, Block 5.

In Block 5, the PFD is displayed to the output device. On the display, icons represent the different types of processing nodes in the process model and lines represent the different process streams. The icons are placed in the node coordinates as previously calculated, and the lines follow the previously calculated stream routing. The PFD can be displayed to the output device, including a computer monitor 58, a hardcopy device such as a pen plotter or laser printer, and even a storage means for future reference.

Figure 10:
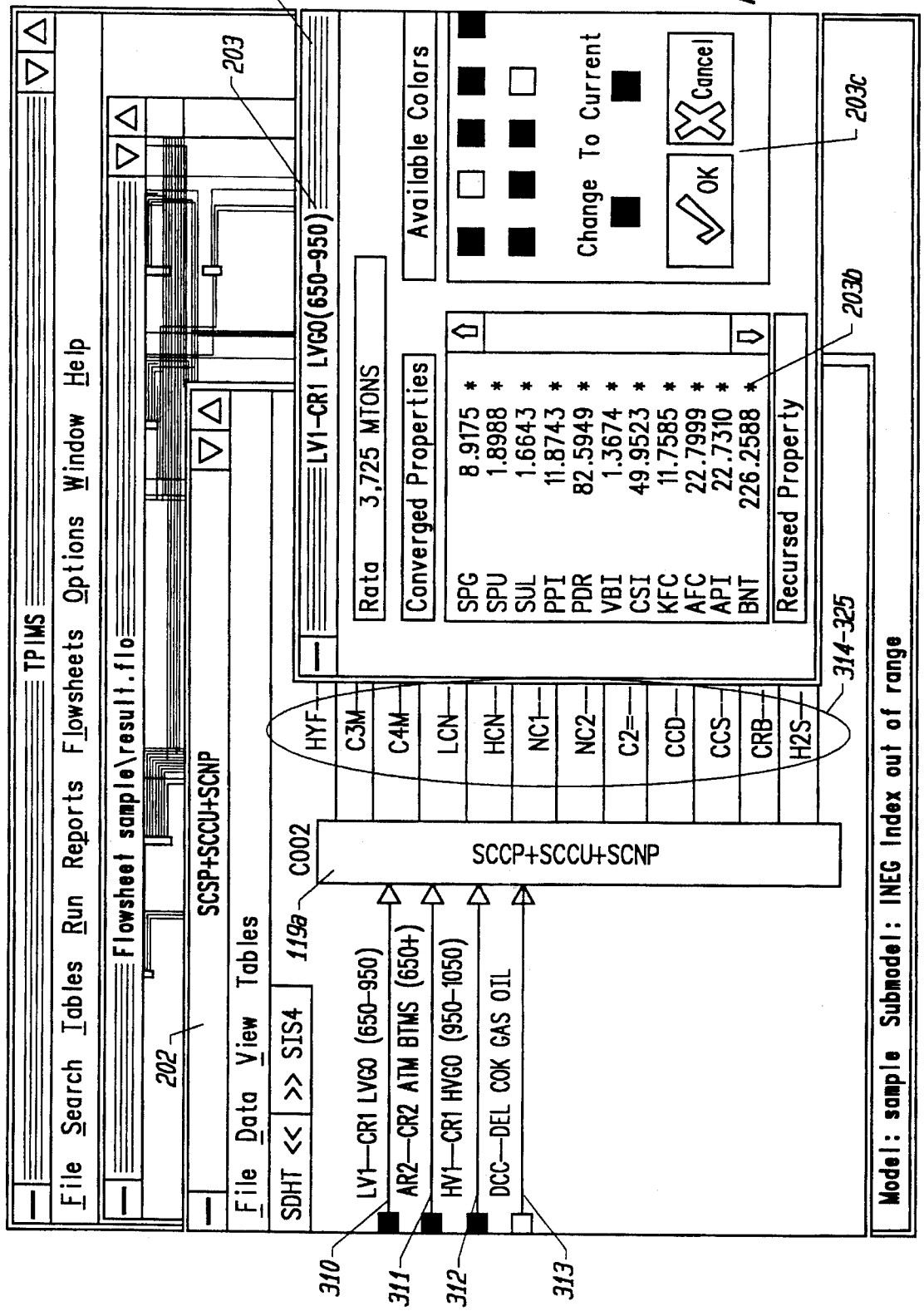
FIG. 10 is an illustration of a user-selected process stream showing stream properties, flow rate, and color selection table.

In a preferred embodiment, the icons representing different processing nodes can be user defined or selected from a menu of icons. Block 36. Lines representing different process streams can be assigned different colors or textures for ease of user identification. An embodiment of the user capability is shown in FIG. 10. In window 203, sub menu 203c, a user is given a palette of colors and can select a particular color for each process stream in the PFD.

Figure 6:
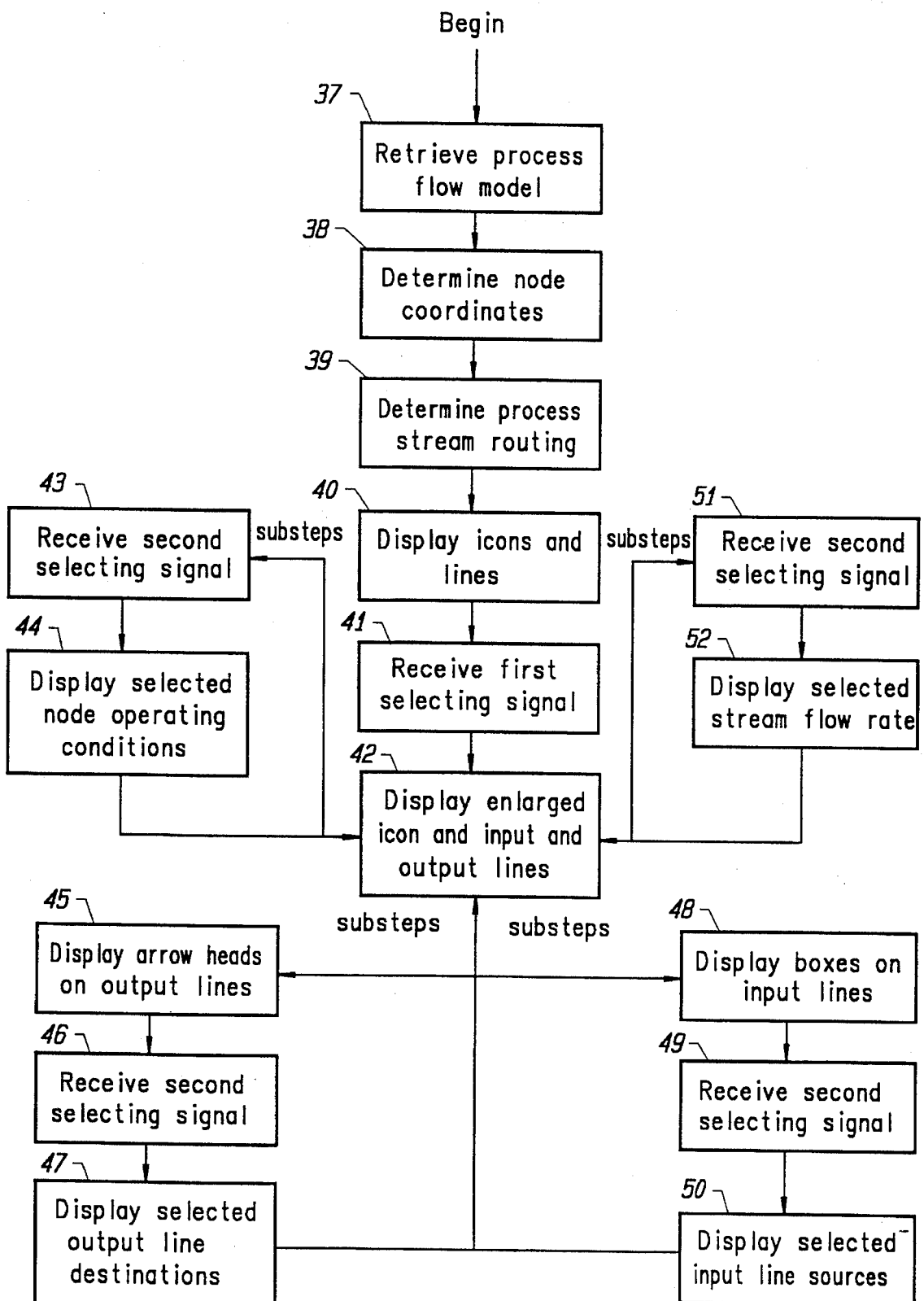
FIG. 6 is a flowchart for another embodiment of the invention.

Another embodiment of the present invention is shown in FIG. 6. In FIG. 6, the embodiments of Blocks 37–40 have the same functionality as that of Blocks 2–36 in FIGS. 3 and 4. In FIG. 6, further processing by Blocks 41–52 is provided.

After a PFD is generated by Block 40, the PFD is displayed as shown in FIG. 1. In Block 41, the user can send a selecting signal from the input device to select a particular icon. As a result of this selecting signal, the selected icon is enlarged and displayed onto the output device, Block 42. Also displayed enlarged are the associated input lines into the icon and output lines from the icon.

Figure 7:
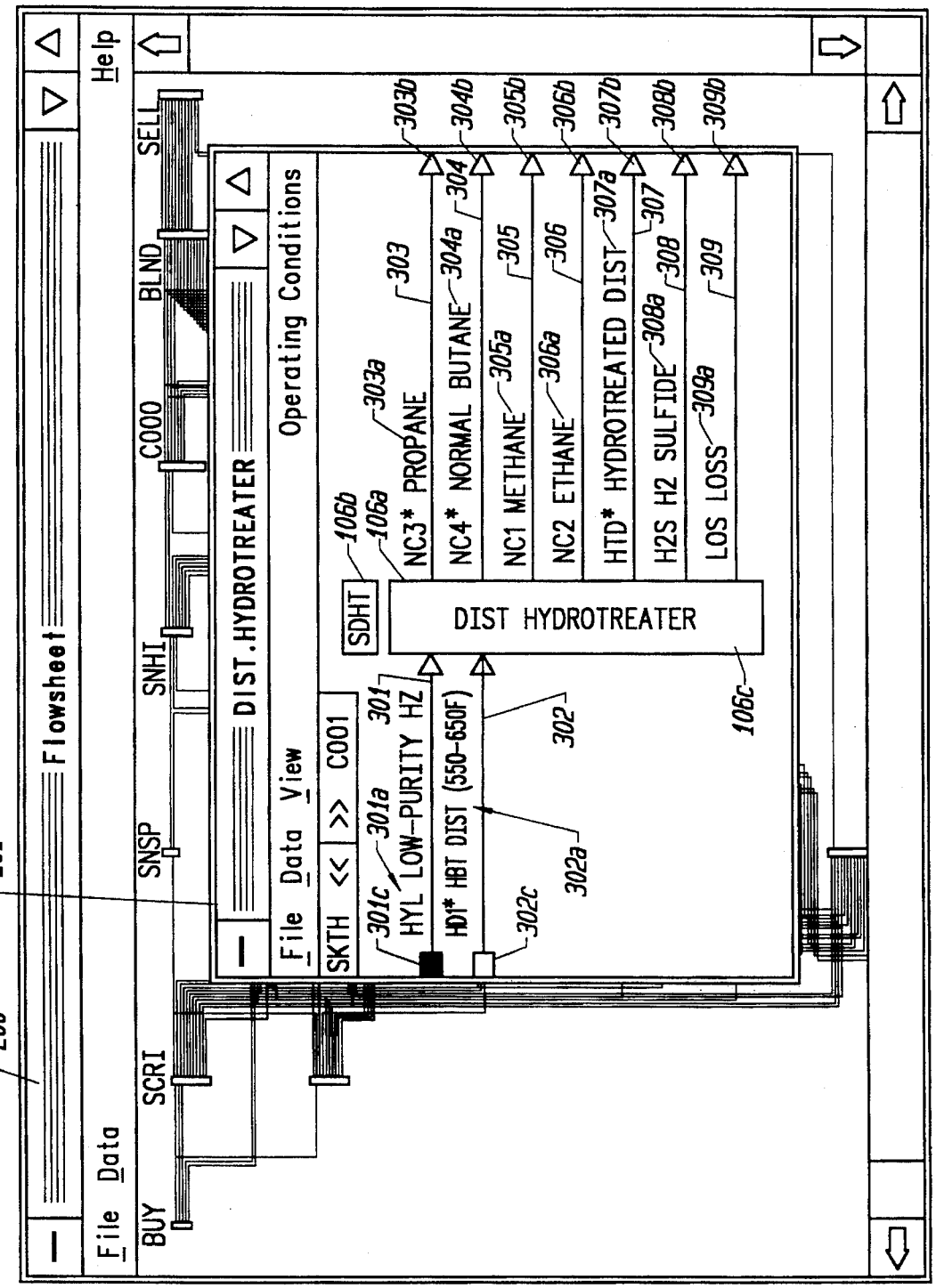
FIG. 7 is an illustration of an enlarged user-selected icon.

An example of an embodiment of the output from Block 42 is shown in FIG. 7. In FIG. 7, a PFD is displayed to the output device in window 200. Window 201 is generated and overlaid on window 200. In this new window 201, the enlarged icon 106a is displayed along with the input lines 301 and 302 and output lines 303–309. Text can accompany the enlarged icon 106. In this example, 106c is a description of the processing performed by icon 106a, and 106b is a short-hand identifier for the node. Text can also accompany the lines. In this example 301a–309a are descriptions of the material flowing through the process streams represented by lines 301–309, respectively. In alternative embodiments, upon user request, the actual material flow rate through the process streams can be displayed in the same positions as 301a–309a.

Figure 8:
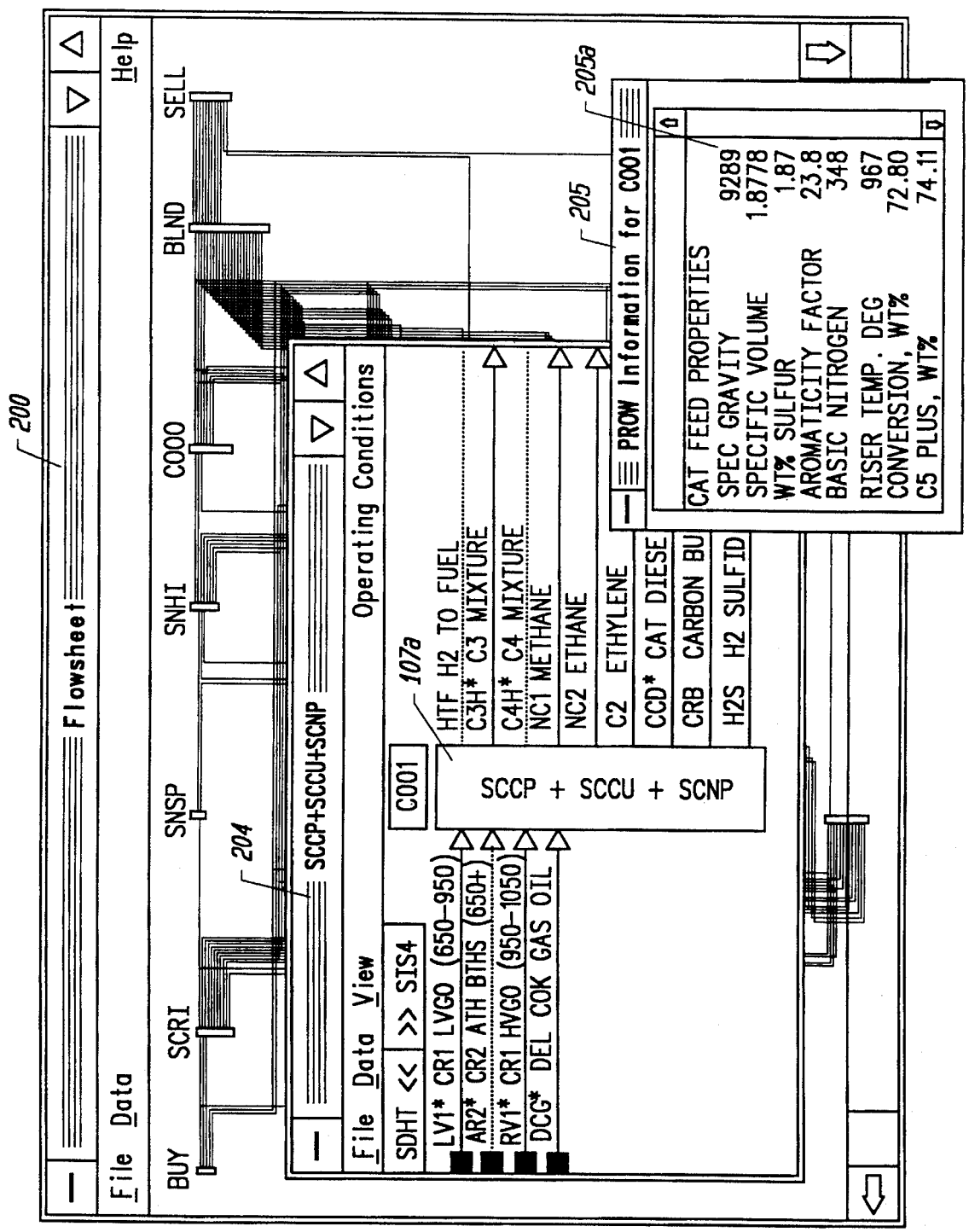
FIG. 8 is an illustration of a user-selected icon showing operating conditions for the selected node.

After the user has selected an icon to enlarge, and it has been displayed onto the output device, the user is given the capability to conveniently obtain process model data about the processing node. In FIG. 6, Block 43, the user can send a selecting signal to select the enlarged icon generated in Block 42. FIG. 8 shows an embodiment of the result of a user selecting the enlarged icon. In FIG. 8, icon 107 was selected from the PFD as shown in overlay window 204. A user can now select the enlarged icon 107a displayed in this new window 204.

In Block 44, text corresponding to the process model data for the selected node is displayed. FIG. 8 shows an embodiment of the displayed text. In response to the selecting signal, an overlay window 205 is generated. Textual information relating to the operating characteristics of the selected icon 107a is then displayed 205a.

Figure 9:
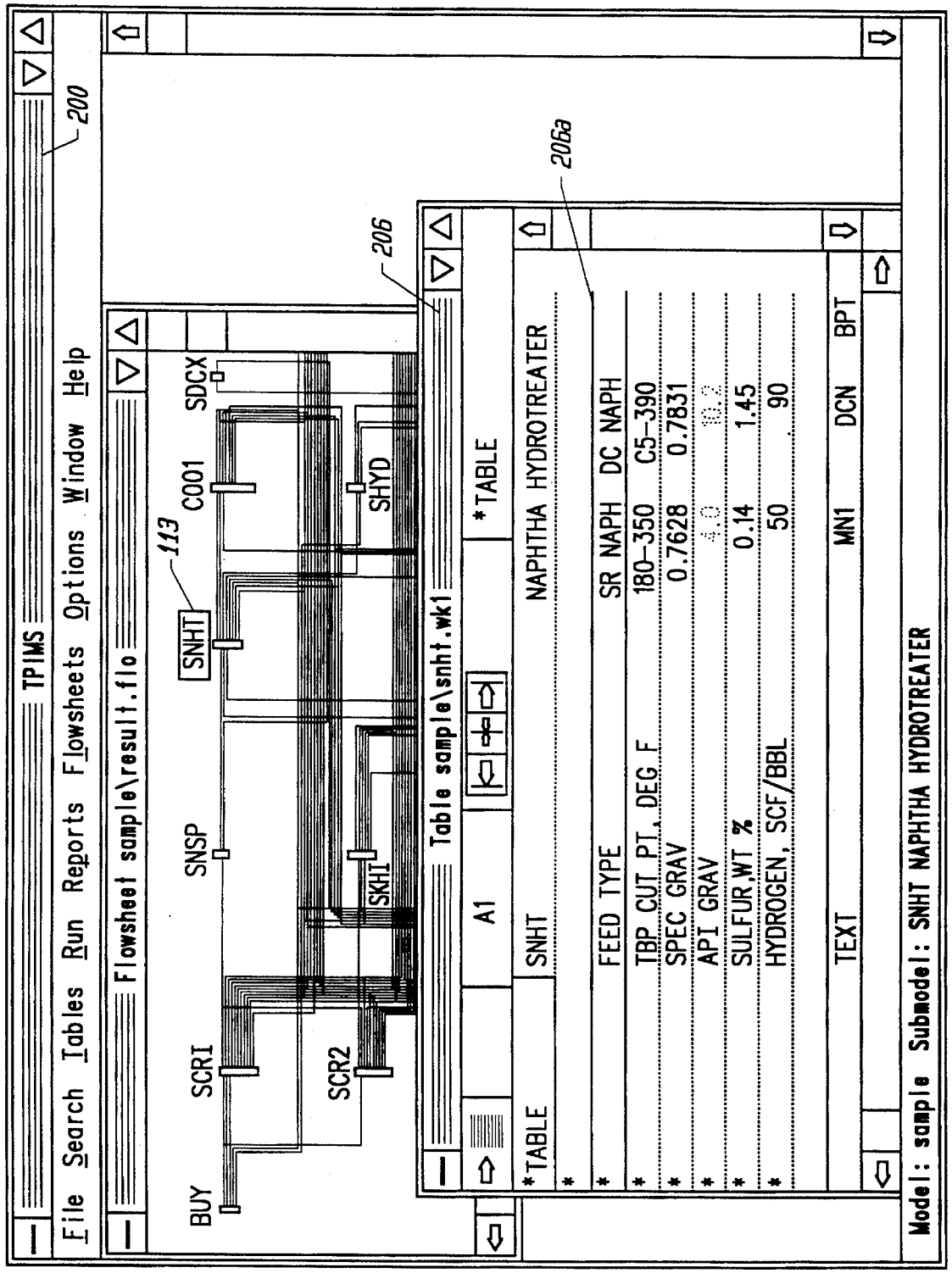
FIG. 9 is an illustration of a user-selected icon showing process model data for the selected node.

Another embodiment of processing Blocks 43 and 44 is shown in FIG. 9. In FIG. 9, icon 113 has been selected from the PFD window 200. In response to the selecting signal, overlay window 206 appears, and the process model data for the selected icon 113 appears in display 206a.

Along with displaying the enlarged icon in Block 42, process streams which provide input into the node and receive output from the node are displayed. In Block 45, arrowheads are placed on the lines showing the direction of material flow in the process stream. An embodiment of this feature is shown as 303b–309b, in FIG. 7. A user can send a selecting signal to select one of the displayed arrowheads, Block 46. In response to this selecting signal, the icons which receive the selected process stream are displayed. In a preferred embodiment, selection of one of the receiving icons results in a display of the enlarged selected receiving icon.

The above function is also provided for input process streams in the enlarged icon in Block 42. In Block 48, boxes are placed on the lines representing material flow supplied by other icons. An embodiment of this feature is shown as 301c and 302c, in FIG. 7. A user can send a selecting signal to select one of the displayed boxes, Block 49. In response to this selecting signal, the icons which supply the selected process stream are displayed. In a preferred embodiment, selection of one of the supplying icons results in a display of an enlarged selected receiving icon.

In Block 51, a user can send a selecting signal to select one of the displayed process stream lines from Block 42. In Block 52, text corresponding to the process model data for the selected line is displayed. FIG. 10 shows an embodiment of the displayed text. In response to the selection of line 310, an overlay window 203 is generated. Textual information relating to the process flow rate is displayed in 203a, and the material properties of the stream are displayed in 203b.

Other capabilities of the present invention include the capability to zoom to only a portion of the PFD for display. The zoom factor can be user-selected for varying levels of display detail. FIG. 11b shows one embodiment which allows the user to select a zoom factor, 207b and 207a. When the PFD has been enlarged to a sufficient extent, textual descriptions of the process streams and descriptions of the icons will automatically appear on the enlarged PFD. It should be obvious that a user can "pan" and "scroll" in a zoomed manner around the PFD.

Figures 1, 11A:
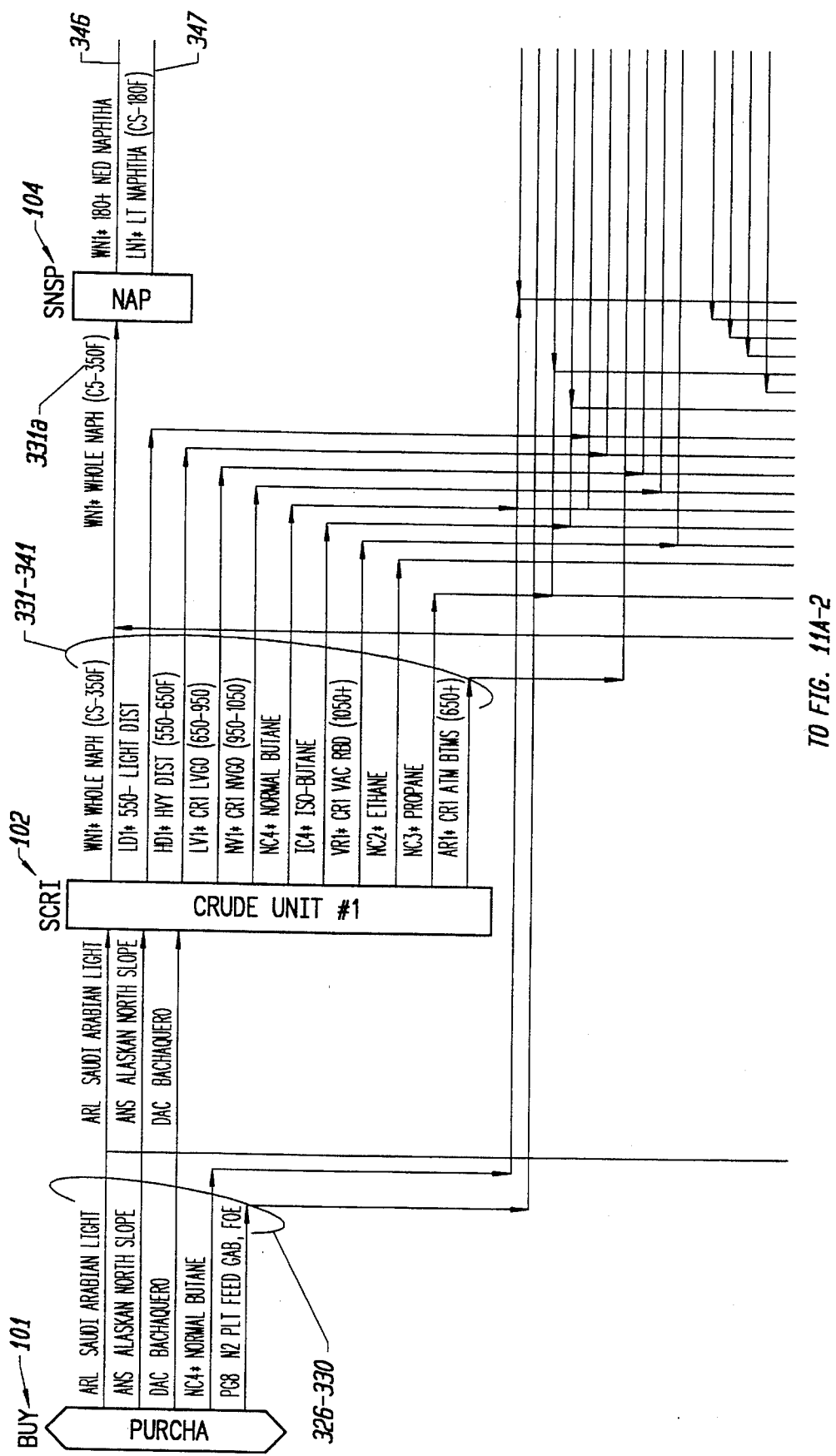
FIG. 11a is an illustration of an automatically generated zoomed Process Flow Diagram.

FIG. 11a represents a zoomed display of the PFD shown in FIG. 2. Nodes 101–106 are displayed along with the associated process streams. Lines 326–330 are output streams from icon 101; lines 331–341 are output streams from icon 102; lines 332, 333, 336, 337, 340, 342–345 are output streams from icon 103; lines 346 and 347 are output streams from icon 104; lines 348–353 are output streams from icon 105, and lines 354–360 are output streams from icon 106.

Figure 12A:
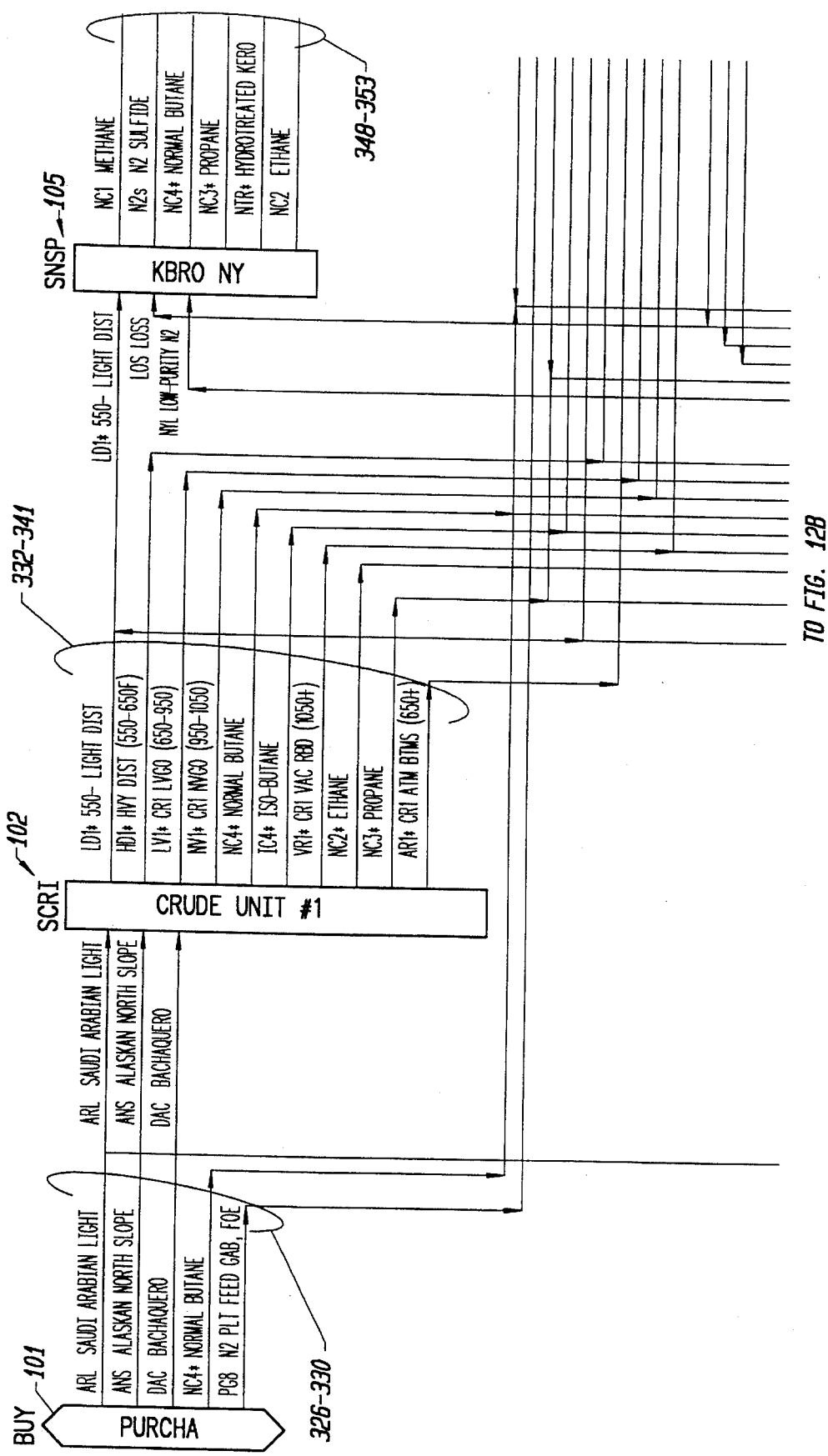
FIG. 12 is an illustration of automatic generation of a Process Flow Diagram after hiding a selected node.
Figure 12B:
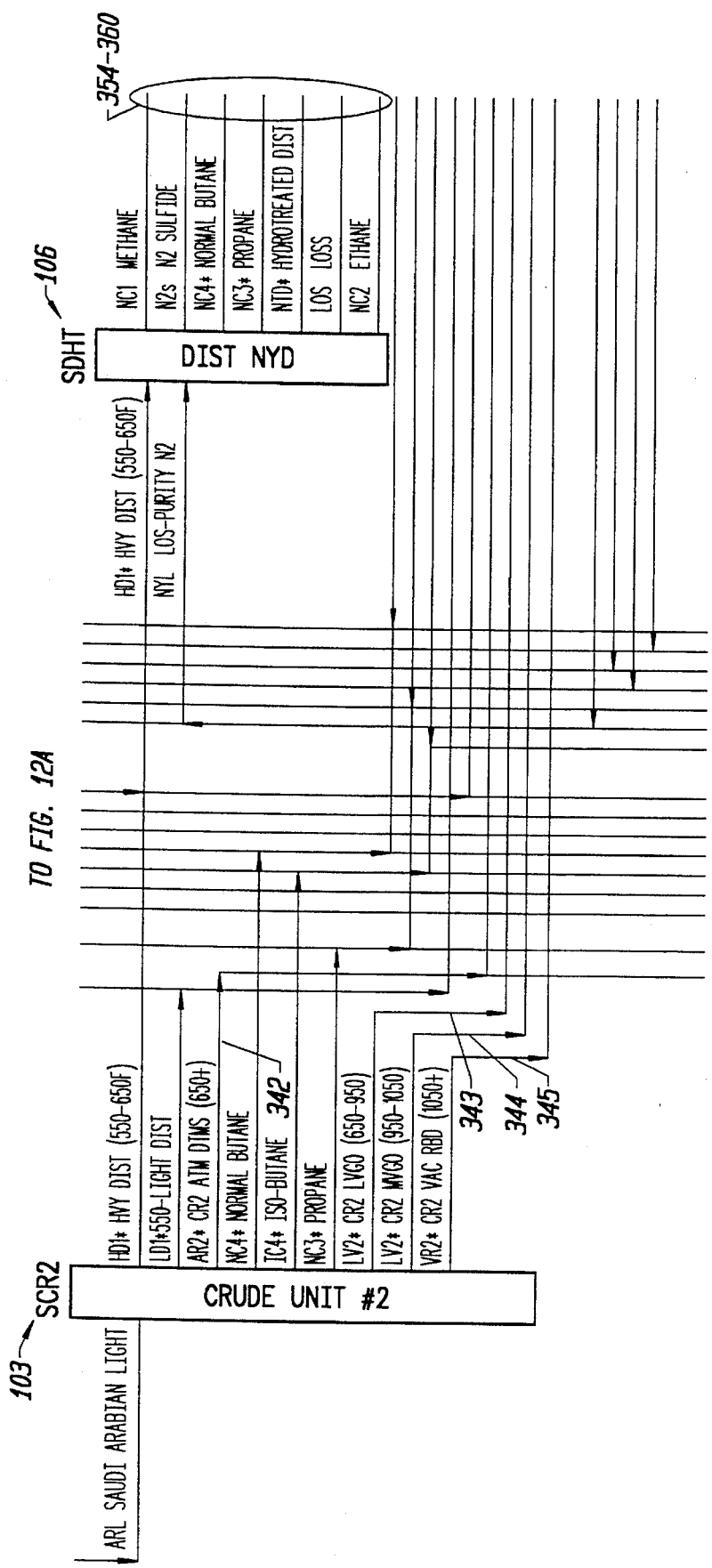

In other embodiments of the present invention, the user can hide icons or lines from the displayed PFD. A typical use of this feature is to isolate and trace select process streams. For example in FIG. 12, the user has selected the same process model as shown in FIG. 11a, but chosen to hide icon 104 from the PFD. Icons 101–103 and 105–106 are still displayed along with Lines 326–345 and 348–360. As can be seen in FIG. 12, the present invention automatically updates the PFD in response to user modifications to the diagram. In FIG. 12, icons 105 and 106 are shifted vertically on the display to fill the gap left by icon 104, and the respective interconnecting lines are automatically rerouted.

The above function is also provided to hide selected lines of data, hide nodes which are not utilized in the process model, or hide lines which have zero flow rate in the process model. A node or a line may not be utilized in a process model as a result of optimization of the model, as previously described.

Figure 13A:
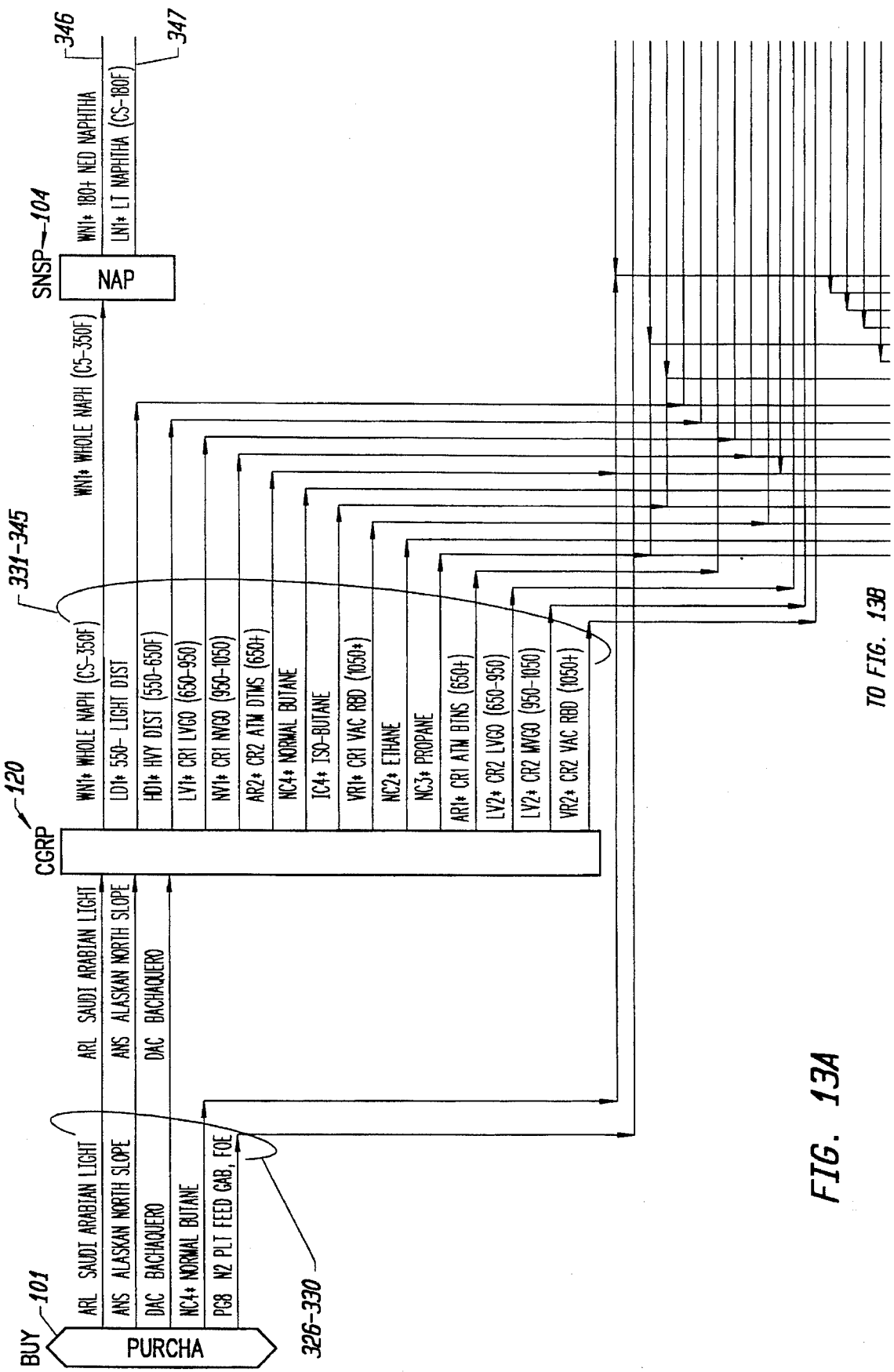
FIG. 13 is an illustration of automatic generation of a Process Flow Diagram after grouping two nodes.
Figure 13B:
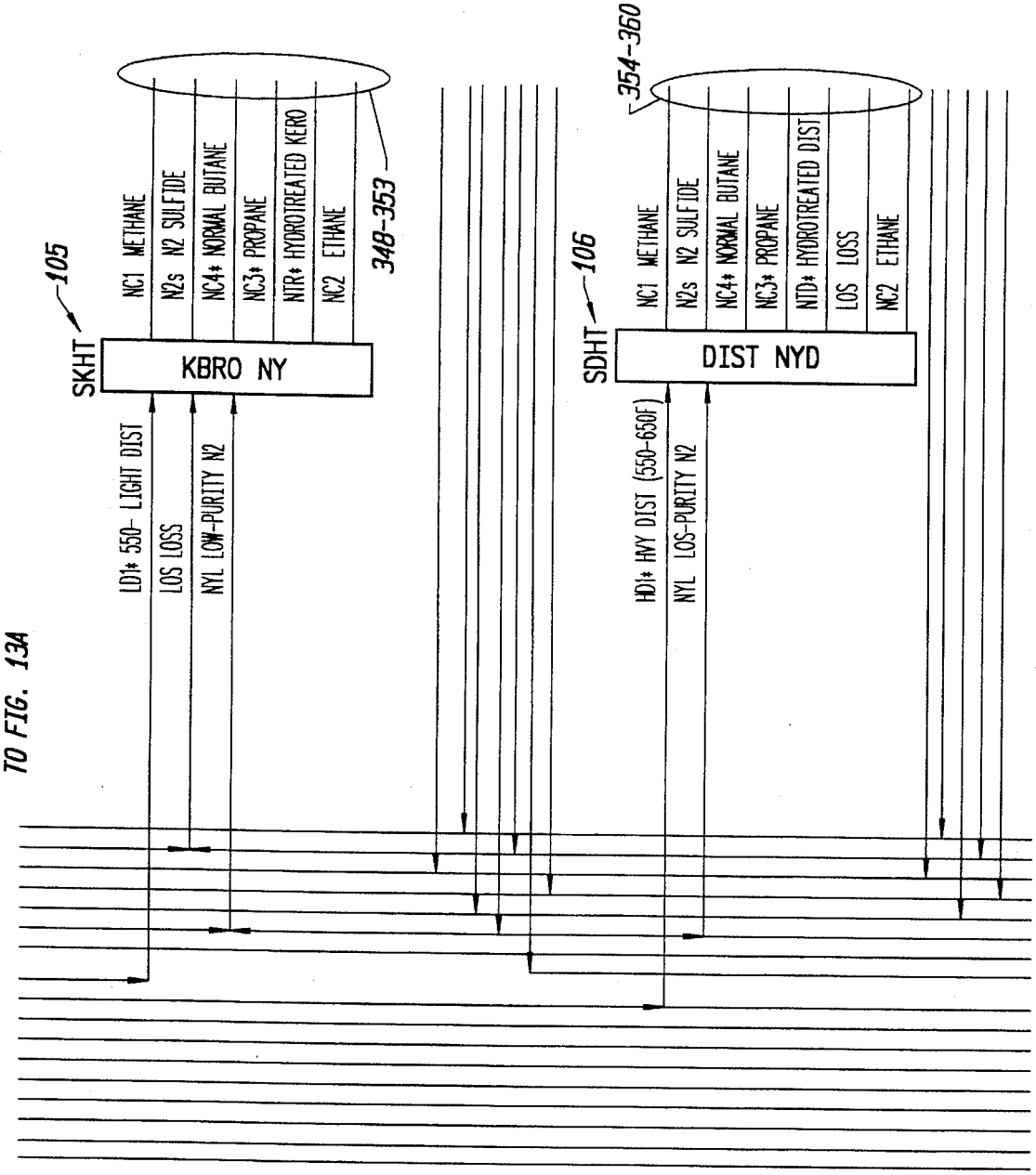

In another embodiment of the present invention, the user can merge nodes into a group node of PFD display. A typical use of this feature is to lessen the complexity of the PFD. For example in FIG. 13, the user has selected the same process model as shown in FIG. 11a, but chosen to merge icons 102 and 103. The resulting grouped node is represented by icon 120. Icons 101, 104–106 are still present with lines 326–360. As can be seen in FIG. 13, the present invention automatically updates the PFD in response to the user modifications. In FIG. 12, icon 120 is created and the interconnecting lines 326–345 are automatically rerouted. It should be obvious that a user can add nodes to an existing group node, delete nodes from an existing group node, and also delete an existing group node from the PFD.

Figure 14:
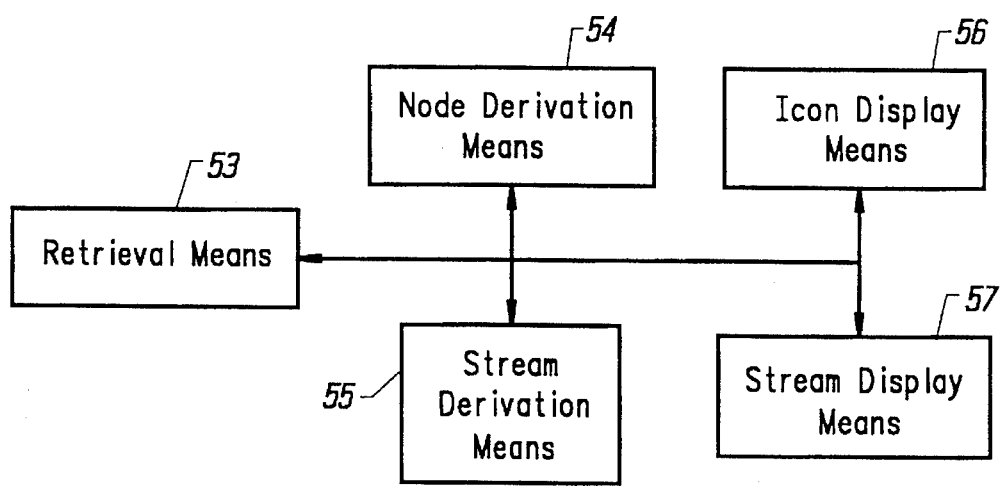
FIG. 14 is an illustration of an automatic PFD generating apparatus.

FIG. 14 represents an apparatus to automatically create the PFD. Block 53 is the retrieval means to retrieve the process model; Block 54 is the node derivation means to place the node on the output display; Block 55 is the process stream derivation means to place the stream routing on the output display; Block 56 is an icon display means to place an icon on the output display at the position of the node; and Block 57 is a stream display means to place a line on the output display at the position of the stream routing.

In the foregoing specification, the invention has been described with reference to a specific exemplary embodiment thereof. It will, however, be evident that various modifications and changes may be made thereunto without departing from the broader spirit and scope of the invention as set forth the appended claims. Many changes or modifications are readily envisioned. For example, he flowcharts used above to illustrate the preferred embodiment may be implemented by one or more software modules or routines. Additionally steps for displaying other portions of the process model may be added. Steps may also be deleted from the flowcharts or performed in a sequence other than that given by the flowcharts without departing from the scope of the invention. The specification and drawings are, accordingly, to be regarded in an illustrative rather than in a restrictive sense.

What is claimed is:

1. A method for creating a process flow diagram from a process model, wherein the process model includes a plurality of process streams and a plurality of nodes, wherein the process streams represent material transfers and the nodes represent processes, the method using a computer system, the computer system including a processor coupled to an output device, user input device and storage means, the method comprising the steps of:

(a) retrieving a plurality of tables of data representing the process model, the process model describing stream data and node data, said node data defining the plurality of nodes and said stream data defining the plurality of process streams between the plurality of nodes;

(b) using the processor, said stream data and said note data to determine corresponding node coordinates for an adjacency matrix between each of the plurality of nodes, the step further comprising the steps of:

(i) creating an adjacency matrix between each of the plurality of nodes;

(ii) subsequent to creating an adjacency matrix, using the processor, said stream data and said node data to identify an origin node, starting node and an ending node;

(iii) creating a placement matrix, with a row dimension and a column dimension, for output placement of the plurality of modes;

(iv) subsequent to creating a placement matrix, placing said origin node in a top row of a first column of said placement matrix;

(v) subsequent to placing said origin node, placing said starting node in a second column of said placement matrix, wherein placement order occurs in said second column from said top row downwards in said placement matrix;

(vi) subsequent to placing said starting node, using said adjacency matrix to determine starting adjacent nodes, said starting adjacent nodes being nodes which are adjacent to said starting node;

(vii) subsequent to using said adjacency matrix to determine starting adjacent nodes placing said starting adjacent nodes into a third column of said placement matrix, wherein placement order occurs in said third column from said top row downwards in said placement matrix; and (viii) subsequent to placing each of the plurality of nodes, placing said ending node in said top row of a last column of said placement matrix;

(c) using the processor, said stream data and said node data to determine corresponding stream routing coordinates for the plurality of process streams between the plurality of nodes; and (d) displaying to the output device an icon for each node at said corresponding respective node row and column coordinates in response to the adjacency matrix and displaying to the output device a line interconnecting two or more icons for each process stream at said corresponding stream routing coordinates.

2. The method of claim 1, wherein substep (i) further comprises the substeps of:

creating an adjacency matrix, with matrix rows and matrix columns, with each of the plurality of nodes associated with an associated matrix row and each of the plurality of nodes associated with an associated matrix column; and using the processor, said stream data and said node data to indicate in each matrix location, whether said associated row node and said associated column node are interconnected by at least one of the plurality of process streams.

3. A method for creating process flow diagram from a process model, wherein the process model includes a plurality process streams and a plurality of nodes, wherein the process streams represent material transfers and the nodes represent processes, the method using a computer system, the computer system including a processor coupled to an output device, user input device and storage means, the method comprising the steps of:

retrieving a plurality of tables of data representing the process model, the process model describing stream data and node data, said node data defining the plurality of nodes and said stream data defining the plurality of process streams between the plurality of nodes;

using the processor, said stream data and said node data to determine corresponding node coordinates for an adjacency matrix between each of the plurality of nodes;

using the processor, said stream data and said node data to determine corresponding stream routing coordinates for the plurality of process streams between the plurality of nodes;

displaying to the output device an icon for each node at said corresponding respective node row and column coordinates in response to the adjacency matrix and displaying to the output device a line interconnecting two or more icons for each process stream at said corresponding stream routing coordinates;

allocating a right vertical path array for the plurality of nodes;

allocating a left vertical path array for the plurality of nodes;

allocating a horizontal path array for the plurality of nodes;

using the processor, said stream data and said node data to detect direct across paths between nodes with dissimilar horizontal coordinates and similar vertical coordinates and updating said right vertical path array and said left vertical path array according to said direct across paths;

using the processor, said stream data and said node data to detect diagonal across paths between nodes with similar horizontal coordinates and dissimilar vertical coordinates and updating said right vertical path array and said left vertical path array according to said diagonal across paths;

using the processor, said stream data and said node data to detect distant paths between nodes with dissimilar horizontal coordinates and dissimilar vertical coordinates and updating said right vertical path array, said left vertical path array, and said horizontal path array according to said distant paths; and using the processor said stream data and said node data to detect same column paths between nodes with similar vertical coordinates and updating said right vertical path array, said left vertical path array, and said horizontal path array according to said same column paths.

4. The method of claim 3, further comprising the step of:
detecting when said plurality of process streams into each of the plurality of nodes have similar material transfers and updating said right vertical path array, said left vertical path array, and said horizontal path array.

5. The method of claim 3, further comprising the step of:
subsequent to updating said right vertical path array, said left vertical path array and said horizontal path array, determining final node coordinates for each of the plurality of nodes, wherein said final node coordinates are used as said corresponding node coordinates in the step of displaying the output device.

6. The method of claim 5, wherein the step of determining final node coordinates comprises the substeps of: determining associated horizontal and associated vertical spaces to be added to each of the plurality of nodes in response to associated said right vertical path array, said left vertical path array, and said horizontal path array; and moving said corresponding node coordinates for each of the plurality of nodes in response to said associated horizontal and said associated vertical spaces.

\* \* \* \* \*